US006645632B2

(12) United States Patent
Honda et al.

(10) Patent No.: US 6,645,632 B2
(45) Date of Patent: Nov. 11, 2003

(54) FILM-TYPE ADHESIVE FOR ELECTRONIC COMPONENTS, AND ELECTRONIC COMPONENTS BONDED THEREWITH

(75) Inventors: Tsuyoshi Honda, Gunma-ken (JP); Nobuhiro Ichiroku, Gunma-ken (JP); Toshio Shiobara, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/808,186

(22) Filed: Mar. 15, 2001

(65) Prior Publication Data

US 2001/0031828 A1 Oct. 18, 2001

(30) Foreign Application Priority Data

Mar. 15, 2000 (JP) ....................................... 2000-072007

(51) Int. Cl.$^7$ ........................ B32B 27/28; C09J 163/00; C08L 79/08; C08L 63/00

(52) U.S. Cl. .................... 428/413; 428/447; 428/473.5; 156/329; 156/330; 525/421; 525/423; 525/432; 525/436

(58) Field of Search ................................. 525/423, 421, 525/432, 436; 428/446, 447, 413, 448, 414, 473.5; 156/329, 330

(56) References Cited

U.S. PATENT DOCUMENTS 6,187,874 B1 * 2/2001 Yoshioka et al. ........... 525/421
6,210,811 B1 4/2001 Honda et al.

FOREIGN PATENT DOCUMENTS

JP 335389 12/1998

OTHER PUBLICATIONS

Nitto Technical Report, vol. 36, No. 1, pp. 24–29 (1998).

* cited by examiner

*Primary Examiner*—Robert Dawson
*Assistant Examiner*—Michael J Feeley
(74) *Attorney, Agent, or Firm*—Birch, Stewart, Kolasch & Birch, LLP

(57) ABSTRACT

A film-type adhesive for electronic components comprises a polyimide resin made up of specific repeating units and having a weight-average molecular weight of 5,000–150,000 in combination with an epoxy resin bearing at least two glycidyl groups per molecule. The adhesive has a weight ratio of the polyimide resin to the epoxy resin within a range of 50/50 to 5/95, and a film thickness of 20–150 $\mu$m. Such a film-type adhesive makes it possible to simplify and shorten the duration of assembly operations for electronic components having various types of adherend surfaces.

9 Claims, 1 Drawing Sheet

Figure 1:
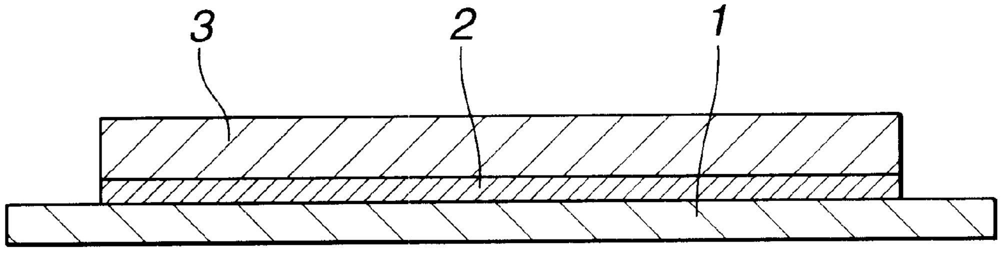

FILM-TYPE ADHESIVE FOR ELECTRONIC COMPONENTS, AND ELECTRONIC COMPONENTS BONDED THEREWITH

BACKGROUND OF THE INVENTION

1. Field of the Invention

The present invention relates to a film-type adhesive for electronic components, which adhesive can be easily and efficiently handled and, when subjected to low-temperature, short-duration treatment, exhibits excellent solvent resistance and excellent adhesion to adherend surfaces of various constructions. The invention relates also to electronic components bonded using such an adhesive.

2. Prior Art

Polyimide resins have excellent heat resistance and electrical insulating properties, and are widely used as adhesives for bonding electronic components. Although they are usually employed in the form of solutions, polyimide resins are soluble only in a limited number of high-boiling solvents. Accordingly, it is common practice to coat the adherend with a solution of polyamic acid, a polyimide precursor which is soluble in a variety of solvents, and carry out extended heat treatment at a temperature of at least 300° C. to effect dehydration and imidization. However, such heat treatment may cause heat deterioration of the adherend. On the other hand, insufficient heating may leave residual polyamic acid in the resin layer, lowering the resistance to moisture and corrosion.

In one known method that addresses such problems, a resin film is formed by coating the adherend with a solution of solvent-soluble polyimide, then heating to remove the solvent. However, the resulting resin layer often has a lower solvent resistance.

Because these prior-art methods use the adhesive in the form of a solution, complications are encountered in applying the solution, removing the solvent, and handling of the adhesive in general. Problems arise unless sufficient solvent is removed. Namely, when the adhesive is exposed to elevated temperatures in later operations, as in the case of die bonding materials in semiconductor devices in particular, the residual solvent vaporizes, forming voids, which may cause delamination and cracking.

SUMMARY OF THE INVENTION

Therefore, it is an object of the invention to provide a film-type adhesive for electronic components which can be easily and efficiently handled and which, when subjected to low-temperature, short-duration treatment, exhibits excellent solvent resistance and excellent adhesion to adherend surfaces of various constructions. Another object of the invention is to provide electronic components bonded using such an adhesive.

The inventor has found that by dissolving in a solvent a polyimide resin (A) of a specific structure and molecular weight that is composed of repeating units of structural formula (1) below in combination with an epoxy resin (B) having two or more glycidyl groups per molecule, in a weight ratio of component (A) to component (B) within a range of 50/50 to 5/95, and subsequently removing the solvent from the solution to form a film having a thickness of 20 to 150 μm, there can be obtained a highly reliable adhesive for electronic components which is easy and efficient to handle, which resolves such problems as void formation, delamination and cracking on account of residual solvent, and which has excellent solvent resistance and excellent adhesion, even with low-temperature, short-duration treatment, to various types of adherend surfaces, and especially adherends having an irregular surface as well as those having a smooth surface.

Accordingly, the invention provides a film-type adhesive for electronic components that comprises (A) a polyimide resin comprising repeating units of structural formula (1) below and having a weight-average molecular weight of 5,000 to 150,000 and (B) an epoxy resin having at least two glycidyl groups per molecule, which adhesive has a weight ratio of component (A) to component (B) of 50/50 to 5/95 and a film thickness of 20 to 150 μm.

(1)

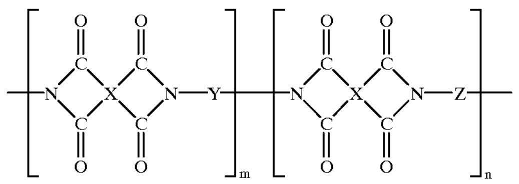

X is at least one tetravalent organic group selected from the following.

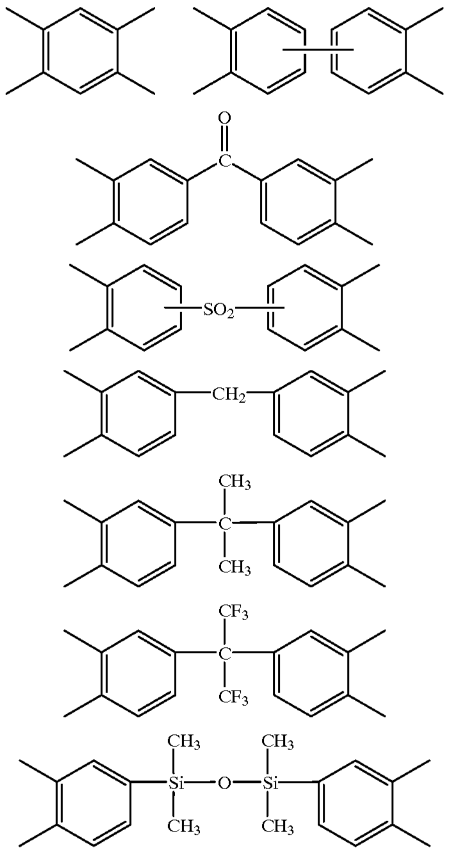

Y is a divalent organic group composed of 30 to 99 mol % of one or more phenolic hydroxyl group-bearing aromatic diamine residue $Y_1$ selected from among (Y1)

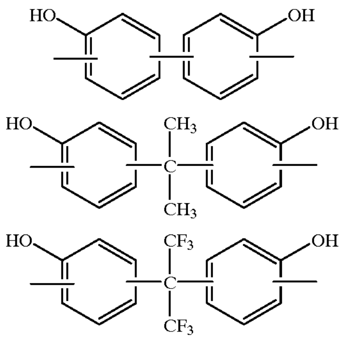

and 70 to 1 mol % of one or more aromatic diamine residue $Y_2$ selected from among (Y2)

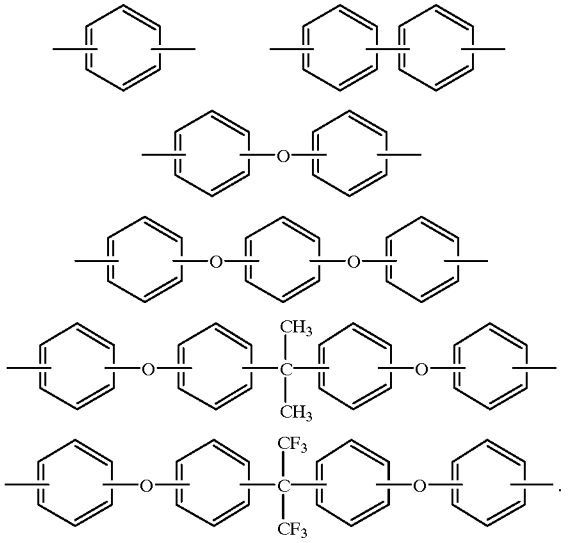

Z is a siloxane diamine residue of the following formula:

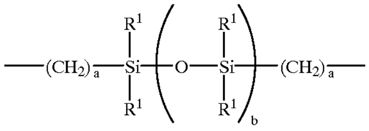

wherein $R^1$ is a substituted or unsubstituted monovalent hydrocarbon group of 1 to 10 carbon atoms, the letter "a" is an integer from 1 to 6, and b is an integer from 1 to 120.

The letters m and n are positive numbers which satisfy the conditions $0.70 \leqq m/(m+n) \leqq 0.98$ and $0.02 \leqq n/(m+n) \leqq 0.30$.

BRIEF DESCRIPTION OF THE DIAGRAM

The only FIGURE, FIG. 1 is a schematic diagram of a semiconductor device used for evaluating the adhesive properties of film-type adhesives in Examples.

DETAILED DESCRIPTION OF THE INVENTION

The polyimide resin used in the adhesive of the invention is comprised of recurring units of structural formula (1) which units have phenolic hydroxyl groups and a diorganosiloxane skeleton. The phenolic hydroxyl groups contribute to the crosslink density and solvent resistance of the cured product, while the diorganosiloxane skeleton contributes to the lower elasticity and the adhesive properties of the cured product.

(1)

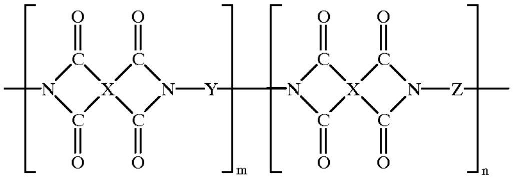

In structural formula (1), X represents a tetravalent organic group. Specific examples include the following.

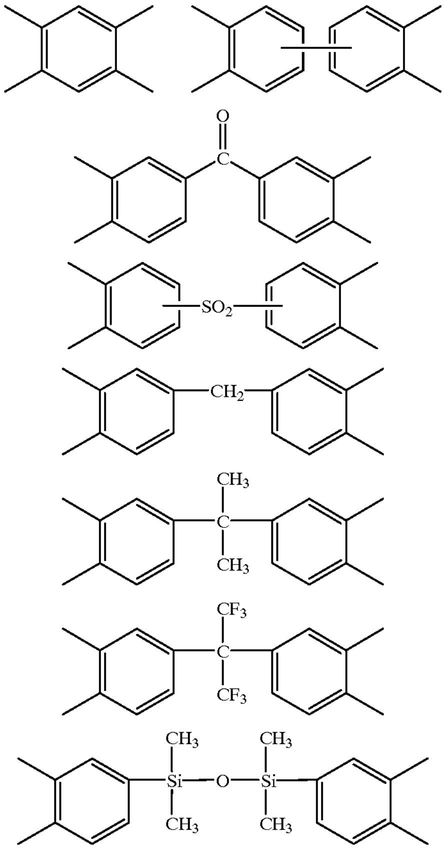

Of these, 2,2-diphenylperfluoropropane and diphenylsulfone residues are desirable for improving the solvent solubility of the uncured material, siloxane-containing groups are desirable for improving adhesion to the adherend, and biphenyl residues are desirable for improving the hardness of the cured product.

In structural formula (1), Y stands for organic groups composed of 30 to 99 mol % of phenolic hydroxyl group-bearing aromatic diamine residues $Y_1$ selected from among (Y$_1$)

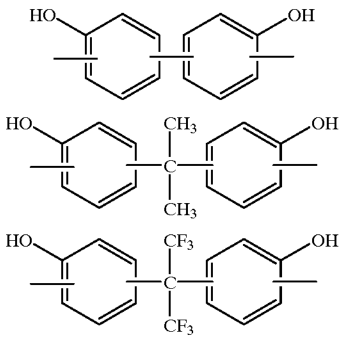

and 70 to 1 mol % of aromatic diamine residues $Y_2$ selected from among (Y$_2$)

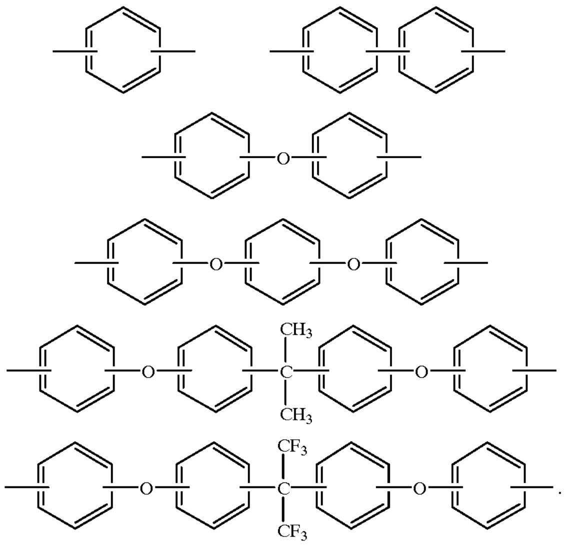

Fewer than 30 mol % of phenolic hydroxyl group-bearing aromatic diamine residues $Y_1$ lowers the crosslink density of the cured product and lowers its solvent resistance. The combined amount of $Y_1$ and $Y_2$ is 100 mol %.

In structural formula (1), Z is a siloxane diamine residue of the following formula.

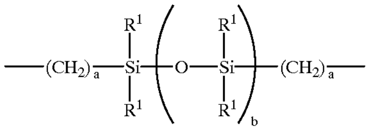

In the above formula, $R^1$ is a substituted or unsubstituted monovalent hydrocarbon group having 1 to 10 carbon atoms, and preferably 1 to 8 carbon atoms. Illustrative examples include alkyl groups such as methyl, ethyl, n-propyl, isopropyl, n-butyl, isobutyl, tert-butyl, pentyl, neopentyl, hexyl, cyclohexyl, octyl and decyl; alkenyl groups such as vinyl, allyl, propenyl and butenyl; aryl groups such as phenyl and tolyl; aralkyl groups such as benzyl and phenylethyl; and halogenated monovalent hydrocarbon groups in which some or all of the hydrogens on the foregoing hydrocarbon groups have been substituted with halogen atoms such as fluorine, bromine or chlorine. Methyl is especially preferred. The letter “a” is an integer from 1 to 6, and is preferably 3. The letter b is an integer from 1 to 120, and is preferably an integer from 1 to 80. At values for b which are greater than 120, the polyimide resin within the uncured material has insufficient solvent solubility.

In structural formula (1), m and n represent positive numbers which satisfy the conditions $0.70 \leqq m/(m+n) \leqq 0.98$ and $0.02 \leqq n/(m+n) \leqq 0.30$. A value n/(m+n) of less than 0.02 compromises adhesion to the adherend and prevents stress reduction in the cured product from being achieved, whereas a value larger than 0.30 lowers the mechanical strength of the cured product. The sum m+n is equal to 1.

The polyimide resin of structural formula (1) has a weight-average molecular weight of 5,000 to 150,000, and preferably 20,000 to 100,000. At less than 5,000, the cured product has insufficient mechanical strength. On the other hand, at more than 150,000, a decline occurs in the amount of carboxyl groups that form by the hydrolysis of terminal functional groups (i.e., amino groups or acid anhydride groups) on the polyimide resin. The result is a decrease in the crosslink density with epoxy resin and a decline in the solvent resistance.

The polyimide resin of structural formula (1) may be produced by a method already known to the art, such as that described subsequently. Illustrative examples of the tetracarboxylic dianhydride used as one of the starting materials in this case include the following.

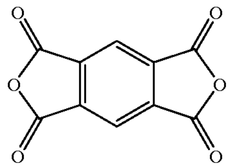

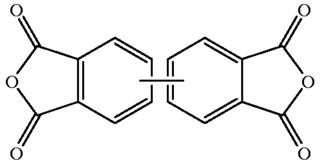

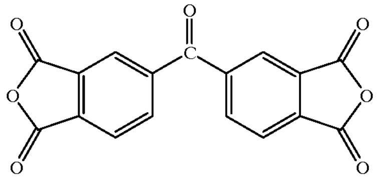

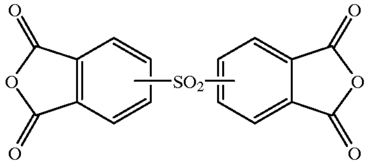

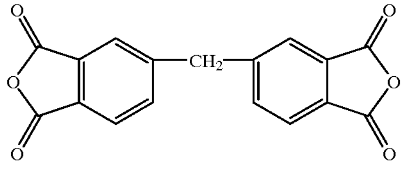

-continued

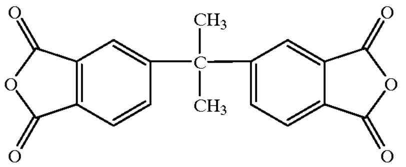

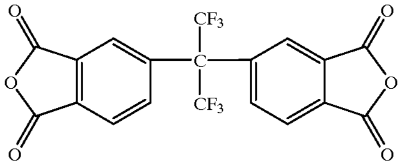

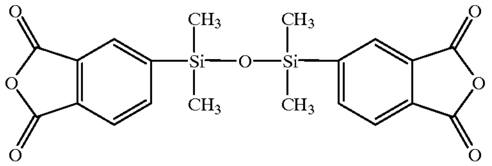

Phenolic hydroxyl group-bearing aromatic diamines that may be used as one of the starting materials include the following.

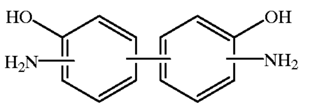

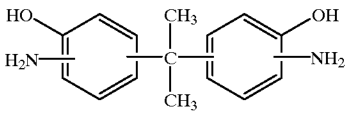

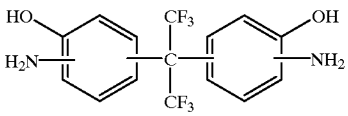

Exemplary aromatic diamines that may be used as a starting material include the following.

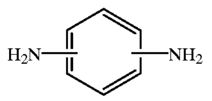 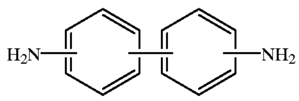

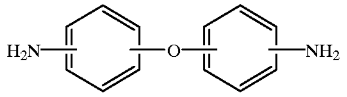

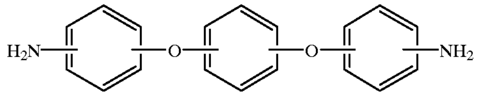

-continued

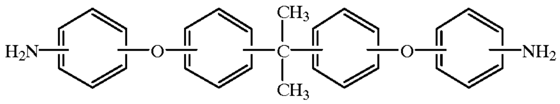

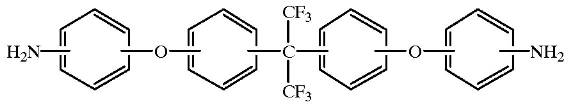

Diaminosiloxanes that may be used as a starting material include α,ω-bis(γ-aminopropyl)diorganopolysiloxanes of the following formula.

(4)

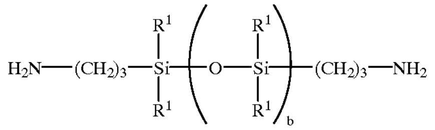

Herein, $R^1$ is as defined above, and b is an integer from 1 to 120.

These starting materials are added to a solvent such as cyclohexanone and reacted at about 20 to 40° C. to synthesize a polyamic acid which serves as the precursor to the polyimide resin. The ratio of the diamine component to the tetracarboxylic dianhydride component may be suitably selected as needed to, for example, adjust the molecular weight of the polyimide resin. A molar ratio within a range of 0.95 to 1.05, and especially 0.98 to 1.02, is preferred. A monofunctional starting material such as phthalic anhydride or aniline may be added to adjust the molecular weight of the polyimide resin. The monofunctional starting material is preferably added in an amount of not more than 2 mol %, based on the polyimide resin. The resulting polyamic acid solution is heated to a temperature of 80 to 200° C., and preferably 140 to 180° C., to induce dehydration ring-closure of the acid amide portions of the polyamic acid, thereby yielding a polyimide resin solution. Alternatively, the polyimide may be prepared by adding an acetic anhydride/pyridine mixed solution to the polyamic acid solution, then heating the resulting mixture to about 150° C. and carrying out imidization.

The epoxy resin used in the invention may be selected from epoxy resins having a broad range of structures and molecular weights as long as it contains at least two glycidyl groups per molecule. Given that the resin composition is to be used in the form of a film, the polyimide resin and epoxy resin are to form a crosslinked structure, and adhesion must be possible at a low-temperature and in a short period of time, the epoxy resin should preferably have a low softening point. The use of one or two epoxy resins of structural formula (2), (3) or (4) below is especially preferred.

(2)

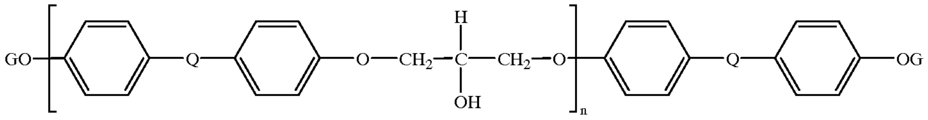

(3)

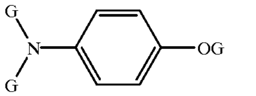

(4)

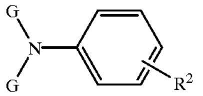

In formulas (2) to (4), G is a glycidyl group of the following formula.

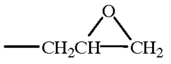

Q is a group selected from among the following.

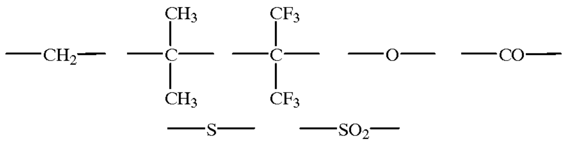

The letter n is an integer from 0 to 5, and $R^2$ is a hydrogen atom or a monovalent hydrocarbon group of 1 to 5 carbon atoms.

Specific examples of the monovalent hydrocarbon group of 1 to 5 carbon atoms represented by $R^2$ include alkyl groups such as methyl, ethyl, n-propyl, isopropyl, n-butyl, isobutyl, tert-butyl, pentyl and neopentyl; and alkenyl groups such as vinyl, allyl, propenyl and butenyl. Methyl and ethyl are especially preferred.

To enable adhesion to be achieved at a low temperature, in a short period of time and under a low load, it is advantageous to use an epoxy resin having a viscosity at 25° C. of at most 20 Pa·sec, preferably at most 10 Pa·sec, and most preferably at most 5 Pa·sec. In this way, even when adhesion is carried out under the application of a low load, good wettability of the resin tape and the adherend is assured. This makes it possible to increase the reliability of adhesion and other properties, thereby eliminating the risk of damage to the adherend, typically a semiconductor chip or other electronic device. Examples of such epoxy resins having a viscosity at 25° C. of at most 20 Pa·sec include epoxy resins of above formula (2) wherein n is 0 to 2, and preferably 0 to 0.1, and epoxy resins of above formula (3) or (4).

In the invention, the weight ratio (A)/(B) between the polyimide resin (A) and the epoxy resin (B) is from 50/50 to 5/95, preferably from 45/55 to 5/95, and most preferably from 40/60 to 10/90. A weight ratio between the polyimide resin and the epoxy resin which is outside the range of the invention and represents too much polyimide resin fails to provide good adhesion, particularly to adhered surfaces having an irregular construction. The result is a poor solvent resistance and moisture resistance. Conversely, the presence of too much epoxy resin prevents the full effects of polyimide resin addition from being achieved, resulting in poor heat resistance.

If necessary, epoxy resins other than those of formulas (2) to (4) may also be used in the adhesive of the invention. Examples of such other epoxy resins include novolac-type epoxy resins such as phenol novolac epoxy resins and biphenyl-type epoxy resins such as cresol novolac epoxy resins.

Depending on the intended application, an inorganic filler may optionally be used in the invention. Specific examples of such inorganic fillers include natural silica such as crystalline silica and non-crystalline silica, synthetic high-purity silica, synthetic spherical silica, talc, mica, silicon nitride, boron nitride, alumina, and electrically conductive particles such as silver powder. Any one or more of these may be employed. In the case of die bonding materials for semiconductor devices, the use of an inorganic filler having a high heat conductivity, such as alumina or silver powder, is preferred. The amount of inorganic filler included in the inventive adhesive is not subject to any particular limitation and may be selected as appropriate for the intended application, although an amount of 85 wt % or less (i.e., 0 to 85 wt t), 5 to 80 wt %, based on the overall composition, is generally suitable.

The inorganic filler is not subject to any particular shape limitations, and may be selected according to the intended application from among inorganic fillers that are spherical, crushed, or of indefinite shape. The inorganic filler has a particle size which is limited by the intended film thickness, the maximum particle size being less than the film thickness, and preferably less than one-half the film thickness. Thus, for an adhesive film having a thickness of 50 μm, the maximum particle size is less than 50 μm and preferably less than 25 μm, and the average particle size is preferably 0.1 to 20 μm and especially 0.5 to 10 μm. The average particle size may be determined, for example, as the weight-average value, or median diameter, with a particle size distribution analyzer that employs a diffraction means such as laser light diffractometry.

An epoxy resin-curing agent is used if desired. It is noted that the curing agent is not always necessary because the epoxy resin used herein can cure by itself (in the event of self-polycondensation type). Some types of suitable curing agents are phenolic resins, acid anhydrides, amines, and imidazoles (i.e., imidazole derivatives). Illustrative examples of phenolic resins that may be used for this purpose include novolac-type phenolic resins such as phenol novolak resin and cresol novolac resin, trishydroxyphenylalkane-type phenol resins such as trishydroxyphenylmethane phenol resin and trishydroxyphenylpropane phenol resin, naphthalene-type phenol resins, cyclopentadiene-type phenol resins and phenolaralkyl resins. Illustrative examples of suitable acid anhydrides include aliphatic acid anhydrides such as dodecenylsuccinic anhydride, poly(adipic anhydride), poly(azelaic anhydride) and poly(sebacic anhydride); alicyclic acid anhydrides such as methyltetrahydrophthalic anhydride, methylhexahydrophthalic anhydride, methylhymic anhydride, hexahydrophthalic anhydride, tetrahydrophthalic anhydride, trialkyltetrahydrophthalic anhydrides and methylcyclohexanedicarboxylic anhydride; and aromatic acid anhydrides such as phthalic anhydride, trimellitic anhydride, pyromellitic anhydride, benzophenonetetracarboxylic anhydride, ethylene glycol bistrimellitate and glycerol tristrimellitate. Specific examples of amines that may be used as the curing agent include aliphatic amines such as ethylenediamine, diethylenetriamine, triethylenetetramine, tetraethylenepentamine, dipropylenediamine, diethylaminopropylamine and hexamethylenediamine; alicyclic amines such as menthenediamine, isophoronediamine, bis(4-amino-3-methyldicyclohexyl)methane, diaminodicyclohexylmethane, bis(aminomethyl) cyclohexane, N-aminoethylpiperazine and 3,9-bis(3-aminopropyl)-2,4,8,10-tetraoxaspiro[5.5]-undecane; and aromatic amines such as m-phenylenediamine, diaminodiphenylmethane, diaminodiphenylsulfone and diaminodiethyldiphenylmethane. Examples of suitable imidazoles include 2-methylimidazole, 2-ethylimidazole, 2-ethyl-4-methylimidazole, 2-phenylimidazole, 2-phenyl-4-methylimidazole, 2-phenyl-4-methyl-5-hydroxymethylimidazole and 2-phenyl-4,5-dihydroxymethylimidazole. Any one or combinations of two or more of these curing agents may be used.

If the epoxy resin-curing agent is a phenolic resin, an acid anhydride or an amine, the curing agent may be included in an amount such that the equivalent ratio of epoxy groups on the epoxy resin to characteristic functional groups on the respective curing agents (i.e., phenolic hydroxyl groups, acid anhydride groups, amino groups) is 0.5 to 1.5, and preferably 0.6 to 1.2. It should be noted here that one mole of the acid anhydride group:

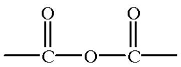

has twice the chemical equivalence of a mole of epoxy groups. An amount of epoxy resin-curing agent outside the above range may result in poor curing and, ultimately, unacceptably low heat and moisture resistance.

In case of using a phenolic resin, an acid anhydride or an amine as a curing agent, an imidazole described later may be used as a curing accelerator in combination of the curing agent.

If the curing agent is an imidazole derivative, it may be included in an amount of up to 5 parts by weight (i.e., 0 to 5 parts by weight) 0.05 to 5 parts by weight, and especially 0.1 to 5 parts by weight, per 100 parts by weight of the polyimide resin. Less than 0.05 part by weight of imidazole derivative may result in a poor low-temperature curability, whereas more than 5 parts by weight may compromise the shelf stability of the adhesive and the heat resistance of the cured product.

As noted above, the polyimide resin used in the invention is synthesized in a solvent. Moreover, the technique employed in the film-forming step involves coating a substrate with the polyimide resin in the form of a solution, then removing the solvent. Hence, it is desirable to use a solvent having excellent compatibility with the resin composition. Specific examples of solvents that may be used for this purpose include ethers such as tetrahydrofuran, anisole, diglyme and triglyme; ketones such as cyclohexanone, 2-butanone, methyl isobutyl ketone, methyl ethyl ketone, 2-heptanone, 2-octanone and acetophenone; esters such as butyl acetate, methyl benzoate, γ-butyrolactone and methyl 2-hydroxypropanoate; cellosolves such as butyl cellosolve acetate and propylene glycol monomethyl ether acetate; amides such as N,N-dimethylformamide, N,N-dimethylacetamide and N-methyl-2-pyrrolidone; and aromatic hydrocarbons such as toluene and xylene. Especially preferred solvents are cyclohexanone, methyl ethyl ketone, γ-butyrolactone, propylene glycol monomethyl ether acetate and N-methyl-2-pyrrolidone. Any one or combinations of two or more of these may be used. It is advantageous to adjust the solvent content in the polyimide resin solution such as to set the solids concentration of the solution within a range of 1 to 40% by weight.

The inventive adhesive for electronic components can be used after it has been rendered into a film having a thickness of 20 to 150 μm. The method of rendering the adhesive into a film is not subject to any particular limitation. Typically, a solution of the resin composition prepared by the above-described method is coated by a device such as coater onto a suitable substrate, such as a silicone resin or Teflon resin film having excellent parting properties, or a PET or other type of film that has been coated with such a resin to confer the film with release properties. After being coated on the substrate, the solution is heated to a given temperature for a given length of time using a heater such as a hot-air heater or an infrared heater to remove the solvent. Depending on the intended application, the resulting film-type adhesive is then cut into sheets or is cut into tape and wound into rolls. If necessary, the substrate may be removed at this point. Insufficient heating during removal of the solvent leaves residual solvent in the film, which may later lead to void formation that could ultimately cause delamination and cracking. On the other hand, excessive heating causes the reaction between the polyimide resin and the epoxy resin to proceed, which detracts from the flexibility and adhesive properties of the film. Moreover, heating that is too rapid, such as when the temperature is suddenly raised above the solvent boiling point, may result in the formation of voids within the film or on the film surface, or may make the film thickness uneven. It is therefore preferable to remove the solvent by heating the applied film in a stepwise manner from a temperature below the boiling point of the solvent.

The inventive film-type adhesive which is a heat-curable resin composition is employed in electronic component applications, and is especially effective in applications requiring heat resistance and adhesive properties, such as die bonding materials for semiconductor devices. The bonding method is not subject to any particular limitation, although thermocompression bonding at a temperature of about 150 to 250° C., a pressure of about 0.01 to 10 kgf/$cm^2$ and for a period of about 0.5 to 20 seconds provides good adhesion to a broad range of adherend materials, including metals such as aluminum, nickel, gold, silver, platinum, iron, copper, zinc, palladium and tin, as well as alloys and oxides thereof, and also silicon and silicon oxide, silicon nitride, epoxy resins, phenolic resins, polyimide resins, and compositions thereof. When an epoxy resin having a viscosity at 25° C. of at most 20 Pa·sec, and especially at most 10 Pa·sec is used, good adhesion can be achieved even by bonding out under a load of only about 0.01 to 1 kgf. One specific bonding method that may be used is to sandwich the adhesive film between two adherends and thermocompression bond the assembly. Another suitable bonding method involves pre-bonding the adhesive film to one adherend, then setting the other adherend on top of the film and carrying out a main bonding operation on the entire assembly. In the latter method in which bonding is carried out in two steps, it is preferable to carry out the pre-bonding step at a relatively low temperature and the main bonding step at a high temperature. In the pre-bonding step, the adhesive film is bonded to a degree sufficient for it to conform to the adherend. In the main bonding step, a strong bond is created, in addition to which the polyimide resin and the epoxy resin react to form a crosslinked structure, giving an adhesive layer having excellent heat and solvent resistance.

By including in the film-type adhesive for electronic components of the invention a considerable amount of epoxy resin, meaning at least equal parts by weight as the amount of specific polyimide resin described above, the film softens sufficiently during thermocompression bonding to assure wettability with the adherend surface. As a result, the inventive adhesive exhibits excellent adhesion not only to smooth adherend surfaces, but also to adherends having a rough or irregular surface construction. Accordingly, the adhesive of the invention is particularly well-suited for use in glass fiber-containing electronic components, such as glass-epoxy resin printed boards.

The film-type adhesives for electronic components of the present invention help to simplify and shorten the duration of assembly operations for electronic components having various types of adherend surfaces. Use of these adhesives makes it possible to produce electronic components of excellent reliability in an easy and efficient manner.

EXAMPLES

Synthesis examples, examples of the invention, and comparative examples are given below by way of illustration, and are not intended to limit the scope of the invention.

Polyimide Resin Synthesis

Synthesis Example 1

A flask equipped with a stirrer, a thermometer and a nitrogen purging unit was charged with 35.8 g (0.1 mol) of 3,3',4,4'-diphenylsulfonetetracarboxylic dianhydride and 400 g of cyclohexanone. Next, a solution prepared by dissolving 16.8 g (0.02 mol) of diaminosiloxane (structural formula (4) in which the average value of b is 9), 10.99 g (0.05 mol) of 4,4'-(3,3'-dihydroxy)diaminobiphenyl and 12.3 g (0.03 mol) of 2,2-bis[4-(4-aminophenoxy)phenyl] propane in 100 g of cyclohexanone was added dropwise to the flask contents while adjusting the temperature of the reaction system so as not to exceed 50° C. Following the completion of dropwise addition, the flask contents were stirred at room temperature for 10 hours.

Next, a reflux condenser fitted with a receiver for collecting moisture was mounted on the flask, 30 g of xylene was added to the flask, and the temperature was raised to 150° C. and held at that level for 6 hours, thereby giving a yellow-brown solution. The resulting solution was cooled to room temperature (25° C.), then poured into methanol to induce re-precipitation. The resulting precipitate was dried, giving a polyimide resin composed of recurring units of the following formula.

In the above formula, $X_1$ is

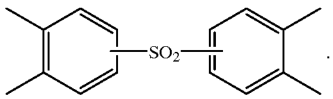

$Y_1$ is a combination of

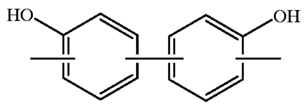

and

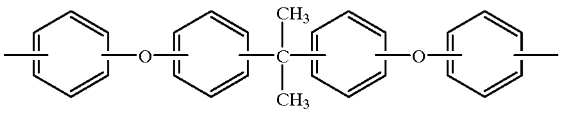

in a molar ratio of 50/30.

The infrared absorption spectrum of the re-precipitated resin was measured. The spectrum was free of absorption attributable to unreacted polyamic acid. Imide group absorption was observed at 1780 $cm^{-1}$ and 1720 $cm^{-1}$. The resin was subjected to gel permeation chromatography using tetrahydrofuran as the solvent, based upon which the polystyrene-equivalent weight-average molecular weight was found to be 35,000. This polyimide resin is referred to below as "Polyimide Resin A."

Synthesis Example 2

A flask equipped with a stirrer, a thermometer and a nitrogen purging unit was charged with 20.5 g (0.07 mol) of 3,3',4,4'-biphenyltetracarboxylic dianhydride, 12.8 g (0.03 mol) of 1,3-bis(3,4-dicarboxyphenyl)-1,1,3,3-tetramethyldisiloxane dianhydride, and 300 g of cyclohexanone. Next, a solution prepared by dissolving 16.8 g (0.02 mol) of diaminosiloxane (structural formula (4) in which the average value of b is 9), 10.99 g (0.05 mol) of 4,4'-(3,3'-dihydroxy)diaminobiphenyl and 12.3 g (0.03 mol) of 2,2-bis[4-(4-aminophenoxy)phenyl]perfluoropropane in 100 g of cyclohexanone was added dropwise to the flask contents while adjusting the temperature of the reaction system so as not to exceed 50° C. Subsequent operations were carried out exactly as in Synthesis Example 1, giving a polyimide resin composed of recurring units of the following formula.

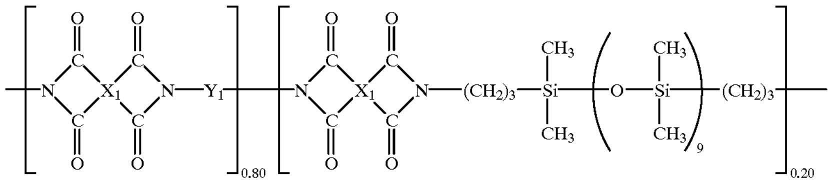

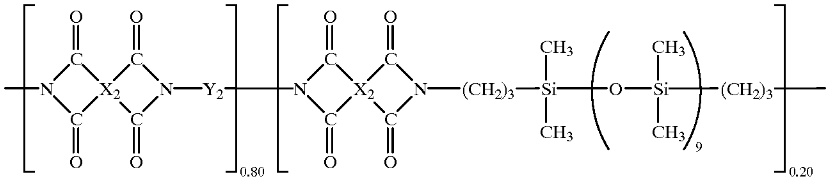

In the above formula, $X_2$ is a combination of

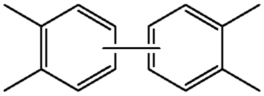

and

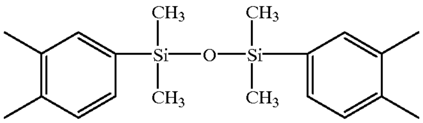

in a molar ratio of 70/30.

$Y_2$ is a combination of

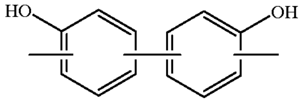

and

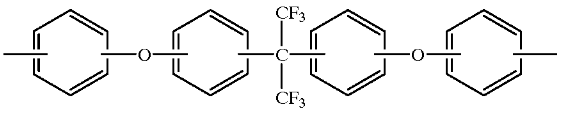

in a molar ratio of 50/30.

The resin had a weight-average molecular weight, measured under the same conditions as in Synthesis Example 1, of 60,000. This polyimide resin is referred to below as "Polyimide Resin B."

Synthesis Example 3

A flask equipped with a stirrer, a thermometer and a nitrogen purging unit was charged with 44.4 g (0.1 mol) of 2,2-bis(3,4-dicarboxyphenyl)perfluoropropane dianhydride and 300 g of cyclohexanone. Next, a solution prepared by dissolving 33.2 g (0.02 mol) of diaminosiloxane (structural formula (4) in which the average value of b is 19), 10.99 g (0.05 mol) of 4,4'-(3,3'-dihydroxy)diaminobiphenyl and 8.78 g (0.03 mol) of 1,4-bis(4-aminophenoxy)benzene in 100 g of cyclohexanone was added dropwise to the flask contents while adjusting the temperature of the reaction system so as not to exceed 50° C. Subsequent operations were carried out exactly as in Synthesis Example 1, giving a polyimide resin composed of recurring units of the following formula.

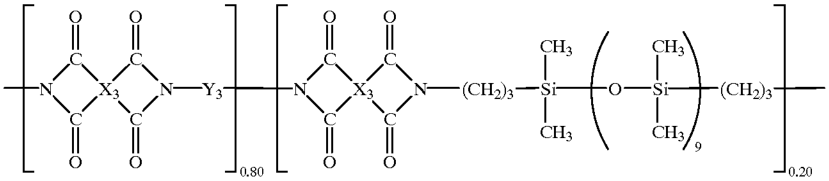

In the above formula, $X_3$ is

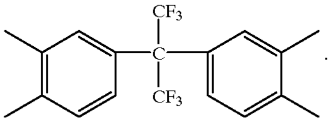

$Y_3$ is a combination of

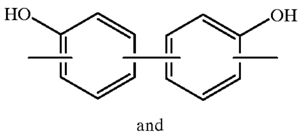

and

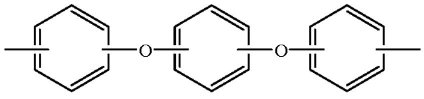

in a molar ratio of 50/30.

The resin had a weight-average molecular weight, measured under the same conditions as in Synthesis Example 1, of 125,000. This polyimide resin is referred to below as "Polyimide Resin C."

Synthesis Example 4

A flask equipped with a stirrer, a thermometer and a nitrogen purging unit was charged with 35.8 g (0.1 mol) of 3,3',4,4'-diphenylsulfonetetracarboxylic dianhydride and 400 g of cyclohexanone. Next, a solution prepared by dissolving 10.99 g (0.05 mol) of 4,4'-(3,3'-dihydroxy) diaminobiphenyl and 20.5 g (0.05 mol) of 2,2-bis[4-(4-amino-phenoxy)phenyl]propane in 100 g of cyclohexanone was added dropwise to the flask contents while adjusting the temperature of the reaction system so as not to exceed 50° C. Subsequent operations were carried out exactly as in Synthesis Example 1, giving a polyimide resin composed of recurring units of the following formula.

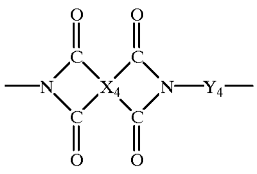

In the above formula, $X_4$ is

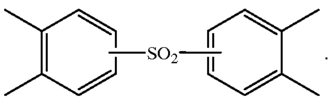

$Y_4$ is a combination of

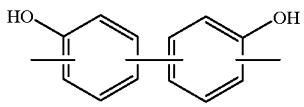

and

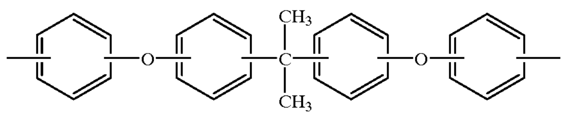

in a molar ratio of 50/50.

The resin had a weight-average molecular weight, measured under the same conditions as in Synthesis Example 1, of 30,000. This polyimide resin is referred to below as "Polyimide Resin D."

Synthesis Example 5

A flask equipped with a stirrer, a thermometer and a nitrogen purging unit was charged with 35.8 g (0.1 mol) of 3,3',4,4'-diphenylsulfonetetracarboxylic dianhydride and 400 g of cyclohexanone. Next, a solution prepared by dissolving 16.8 g (0.02 mol) of diaminosiloxane (structural formula (4) in which the average value of b is 9) and 32.8 g (0.08 mol) of 2,2-bis[4-(4-aminophenoxy)phenyl]propane in 100 g of cyclohexanone was added dropwise to the flask contents while adjusting the temperature of the reaction system so as not to exceed 50° C. Subsequent operations were carried out exactly as in Synthesis Example 1, giving a polyimide resin composed of recurring units of the following formula.

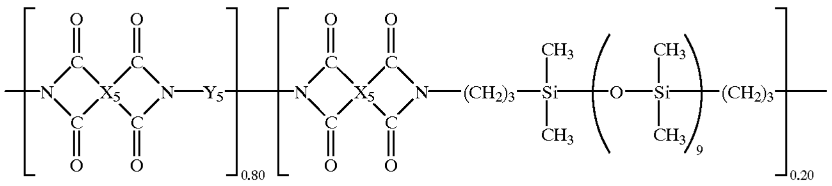

In the above formula, $X_5$ is

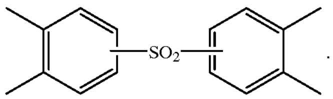

$Y_5$ is

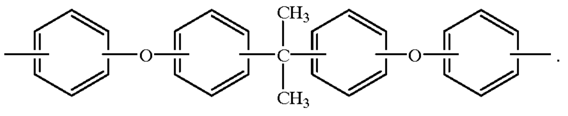

The resin had a weight-average molecular weight, measured under the same conditions as in Synthesis Example 1, of 24,000. This polyimide resin is referred to below as "Polyimide Resin E."

EXAMPLES OF THE INVENTION AND COMPARATIVE EXAMPLES

Preparation of Heat-Curable Resin Compositions

A polyimide resin (above Polyimide Resins A to E), an epoxy resin (Epoxy Resins A to C shown below), a phenolic resin, an acid anhydride, an amine, an inorganic filler (particle size, 1 to 10 μm; silver powder in the form of flakes), an imidazole derivative (2-phenyl-4,5-dihydroxymethylimidazole, abbreviated below as "2PHZ"), and a solvent (methyl ethyl ketone) were blended in the proportions shown in Tables 1 and 2, giving heat-curable resin compositions for the respective examples of the invention and comparative examples. In the tables, proportions are indicated in parts by weight.

Epoxy Resin A:

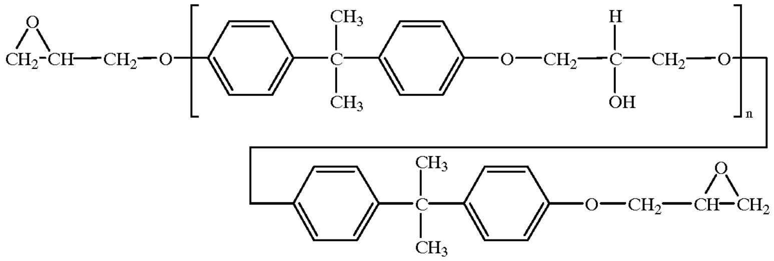

n=0.07 (average value)

epoxy equivalent weight, 180 viscosity at 25° C., 4 Pa·sec

Epoxy Resin B:

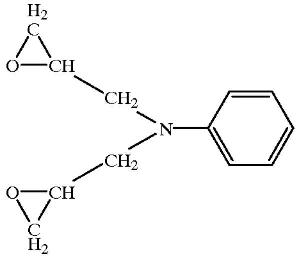

viscosity at 25° C., 0.13 Pa·sec

Epoxy Resin C:

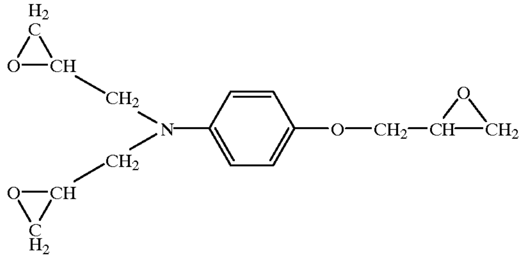

viscosity at 25° C., 7 Pa·sec

Phenolic Resin: Cresol Novolac Resin

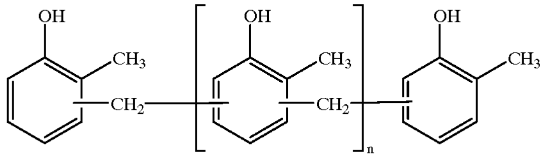

n=1 (average value)

phenolic hydroxyl equivalent weight, 116

Acid Anhydride: 4-methyltetrahydrophthalic Anhydride

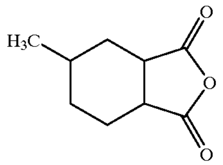

acid anhydride equivalent weight, 84

Amine: 4,4'-diaminodiphenylmethane

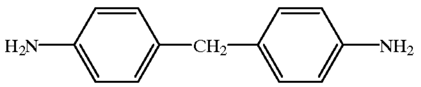

amine equivalent weight, 99

Production of Film-Type Adhesive

The heat-curable resin compositions prepared in the respective examples and comparative examples were each coated onto PET film that had been surface-treated with a silicone parting agent. The coated PET film was then dried, first at 50° C. for 30 minutes then at 80° C. for 30 minutes, to remove the solvent, thereby giving a 50 μm thick film.

The resulting film-type adhesives were subjected to tests (a) to (c) below. The test results are shown in Tables 1 and 2.

(a) Adhesion

The condition between the adherend and the adhesive layer in the semiconductor device shown in FIG. 1 was examined using an ultrasonic flaw detector. The adhesion was rated as the ratio of the number of semiconductor devices in which delamination occurred to the total number of semiconductor devices examined.

(b) Semiconductor Cracking after Moisture Absorption

The semiconductor device shown in FIG. 1 was held for 24 hours in a 121° C., 100% relative humidity atmosphere at a pressure of 2 atm, then dipped in a 240° C. solder bath for 10 seconds. Semiconductor cracking was rated as the ratio of semiconductor devices in which cracking occurred to the total number of semiconductor devices examined.

(c) Solvent Resistance

The semiconductor device shown in FIG. 1 was immersed in methyl ethyl ketone for 5 minutes. The solvent resistance was rated as the ratio of the number of semiconductor devices in which dissolution of the adhesive layer was visible to the total number of semiconductor devices examined.

The semiconductor device shown in FIG. 1 had the following construction. A film-like adhesive 2 (10 mm×10 mm×50 μm) was placed on a leadframe made of copper or Alloy 42 or on a glass-epoxy resin substrate 1, and pre-bonded at 150° C. and 1 $kg/cm^2$ for 1 second. Next, a silicon chip 3 (10×10×0.3 mm) was placed on top of the adhesive and bonded thereto at 240° C. and 100 $kg/cm^2$ for 10 seconds to give a semiconductor device. The glass-epoxy resin substrate had a grid of cylindrical projections, each 100 μm in diameter and 30 μm high, on the adherend surface.

TABLE 1

| Composition (parts by weight) | | EX 1 | EX 2 | EX 3 | EX 4 | EX 5 | EX 6 | EX 7 | EX 8 |
|---|---|---|---|---|---|---|---|---|---|
| Polyimide resin | A | 40 | 25 | 10 | 0 | 0 | 40 | 40 | 40 |
| | B | 0 | 0 | 0 | 40 | 0 | 0 | 0 | 0 |
| | C | 0 | 0 | 0 | 0 | 40 | 0 | 0 | 0 |
| | D | 0 | 0 | 0 | 0 | 0 | 0 | 0 | 0 |
| | E | 0 | 0 | 0 | 0 | 0 | 0 | 0 | 0 |
| Epoxy resin | A | 60 | 75 | 90 | 0 | 0 | 60 | 60 | 60 |
| | B | 0 | 0 | 0 | 60 | 0 | 0 | 0 | 0 |
| | C | 0 | 0 | 0 | 0 | 60 | 0 | 0 | 0 |
| Phenolic resin | | 0 | 0 | 0 | 0 | 0 | 60 | 0 | 0 |
| Acid anhydride | | 0 | 0 | 0 | 0 | 0 | 0 | 44 | 0 |
| Amine | | 0 | 0 | 0 | 0 | 0 | 0 | 0 | 52 |
| Silver powder | | 100 | 100 | 100 | 100 | 100 | 100 | 100 | 100 |
| 2PHZ | | 0.5 | 0.5 | 0.5 | 0 | 0 | 0.5 | 0.5 | 0.5 |
| Methyl ethyl ketone | | 400 | 400 | 400 | 400 | 400 | 400 | 400 | 400 |
| (a) Adhesion | Copper frame | 0/100 | 0/100 | 0/100 | 0/100 | 0/100 | 0/100 | 0/100 | 0/100 |
| | Alloy 42 frame | 0/100 | 0/100 | 0/100 | 0/100 | 0/100 | 0/100 | 0/100 | 0/100 |
| | Glass-epoxy substrate | 0/100 | 0/100 | 0/100 | 0/100 | 0/100 | 0/100 | 0/100 | 0/100 |
| (b) Solder cracking | Copper frame | 0/20 | 0/20 | 0/20 | 0/20 | 0/20 | 0/20 | 0/20 | 0/20 |
| | Alloy 42 frame | 0/20 | 0/20 | 0/20 | 0/20 | 0/20 | 0/20 | 0/20 | 0/20 |
| | Glass-epoxy substrate | 0/20 | 0/20 | 0/20 | 0/20 | 0/20 | 0/20 | 0/20 | 0/20 |
| (c) Solvent resistance | Copper frame | 0/20 | 0/20 | 0/20 | 0/20 | 0/20 | 0/20 | 0/20 | 0/20 |
| | Alloy 42 frame | 0/20 | 0/20 | 0/20 | 0/20 | 0/20 | 0/20 | 0/20 | 0/20 |
| | Glass-epoxy substrate | 0/20 | 0/20 | 0/20 | 0/20 | 0/20 | 0/20 | 0/20 | 0/20 |

TABLE 2

| Composition (parts by weight) | | CE 1 | CE 2 | CE 3 | CE 4 | CE 5 | CE 6 |
|---|---|---|---|---|---|---|---|
| Polyimide resin | A | 55 | 70 | 85 | 3 | 0 | 0 |
| | B | 0 | 0 | 0 | 0 | 0 | 0 |
| | C | 0 | 0 | 0 | 0 | 0 | 0 |
| | D | 0 | 0 | 0 | 0 | 40 | 0 |
| | E | 0 | 0 | 0 | 0 | 0 | 40 |
| Epoxy resin | A | 45 | 30 | 15 | 97 | 60 | 60 |
| | B | 0 | 0 | 0 | 0 | 0 | 0 |
| | C | 0 | 0 | 0 | 0 | 0 | 0 |
| Phenolic resin | | 0 | 0 | 0 | 0 | 0 | 0 |
| Acid anhydride | | 0 | 0 | 0 | 0 | 0 | 0 |
| Amine | | 0 | 0 | 0 | 0 | 0 | 0 |
| Silver powder | | 100 | 100 | 100 | 100 | 100 | 100 |
| 2PHZ | | 0.5 | 0.5 | 0.5 | 0.5 | 0.5 | 0.5 |
| Methyl ethyl ketone | | 400 | 400 | 400 | 400 | 400 | 400 |
| (a) Adhesion | Copper frame | 0/100 | 0/100 | 0/100 | 0/100 | 10/100 | 80/100 |
| | Alloy 42 frame | 0/100 | 0/100 | 0/100 | 0/100 | 10/100 | 70/100 |
| | Glass-epoxy substrate | 20/100 | 50/100 | 100/100 | 0/100 | 80/100 | 10/100 |
| (b) Solder cracking | Copper frame | 0/20 | 0/20 | 0/20 | 20/20 | 20/20 | 20/20 |
| | Alloy 42 frame | 0/20 | 0/20 | 0/20 | 20/20 | 20/20 | 20/20 |
| | Glass-epoxy substrate | 2/20 | 10/20 | 20/20 | 20/20 | 20/20 | 20/20 |
| (c) Solvent resistance | Copper frame | 0/20 | 0/20 | 0/20 | 0/20 | 0/20 | 20/20 |
| | Alloy 42 frame | 0/20 | 0/20 | 0/20 | 0/20 | 0/20 | 20/20 |
| | Glass-epoxy substrate | 0/20 | 0/20 | 0/20 | 0/20 | 0/20 | 20/20 |

Japanese Patent Application No. 2000-072007 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A film-type adhesive for electronic components, consisting essentially of (A) a polyimide resin comprising repeating units of the following structural formula (1) and having a weight-average molecular weight of 5,000 to 150,000 and (B) an epoxy resin having the following structural formula (2), (3) or (4); which adhesive has a weight ratio of component (A) to component (B) of 45/55 to 5/95 and a film thickness of 20 to 150 $\mu$m, (1)

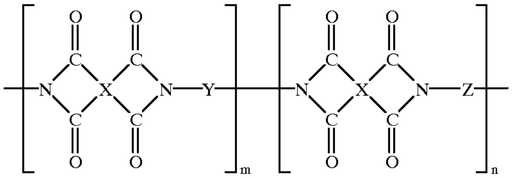

wherein X is at least one tetravalent organic group selected from the group consisting of:

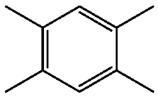

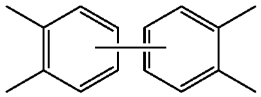

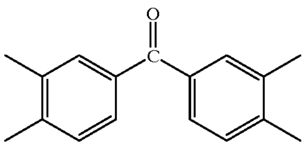

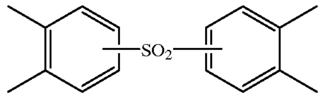

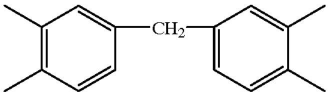

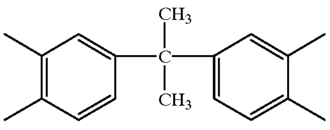

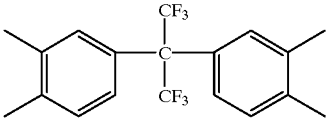

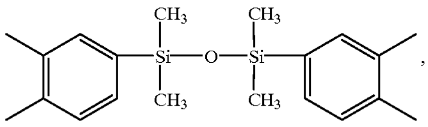

,

Y is a divalent organic group composed of 30 to 99 mol % of at least one phenolic hydroxyl group-bearing aromatic diamine residue $Y_1$ selected from among ($Y_1$)

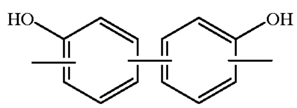

-continued

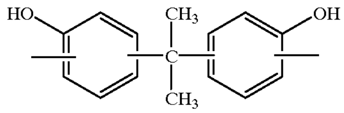

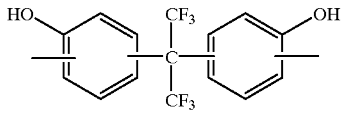

and 70 to 1 mol % of at least one aromatic diamine residue $Y_2$ selected from among ($Y_2$)

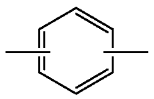

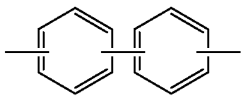

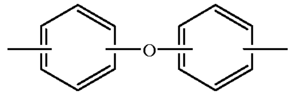

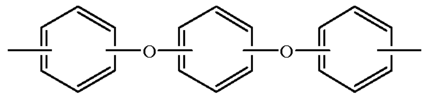

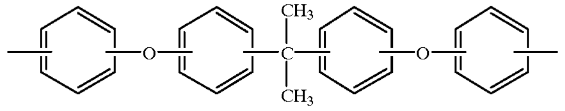

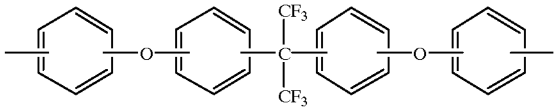

,

Z is a siloxane diamine residue of the following formula:

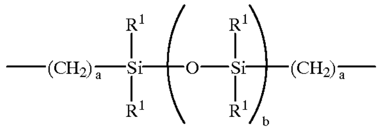

wherein $R^1$ is a substituted or unsubstituted monovalent hydrocarbon group of 1 to 10 carbon atoms, the letter "a" is an integer from 1 to 6, and b is an integer from 1 to 120, and the letters m and n are positive numbers which satisfy the conditions $0.70 \leqq m/(m+n) \leqq 0.98$ and $0.02 \leqq n/(m+n) \leqq 0.30$, and formulas (2), (3) and (4) are as follows:

(2)

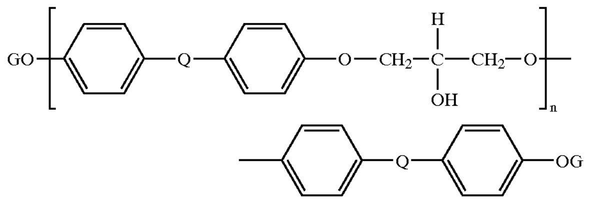

-continued (3)

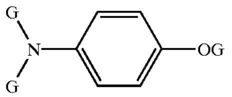

(4)

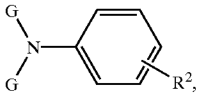

wherein G is a group of the formula:

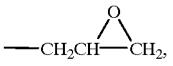

Q is a group selected from the group consisting of:

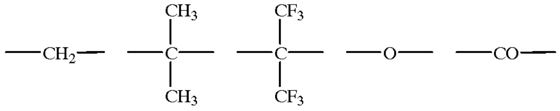

-continued

the letter n is an integer from 0 to 5, and $R^2$ is hydrogen or a monovalent hydrocarbon group of 1 to 5 carbon atoms.

2. The film-type adhesive of claim 1, wherein epoxy resin (B) has a viscosity of up to 20 Pa·sec at 25° C.

3. The film-type adhesive of claim 1, which further comprises (C) an inorganic filler.

4. The film-type adhesive of claim 1, which further comprises (D) at least one epoxy resin-curing agent selected from the group consisting of phenolic resins, acid anhydrides, amines, and imidazole derivatives.

5. An electronic component which is bonded to a substrate by a film-type adhesive of claim 1.

6. The film-type adhesive of claim 1, in which the weight ratio of component (A) to component (B) ranges from 40/60 to 10/90.

7. The film-type adhesive of claim 1, in which the weight ratio of component (A) to component (B) is 40/60.

8. The film-type adhesive of claim 1, in which the weight ratio of component (A) to component (B) is 25/75.

9. The film-type adhesive of claim 1, in which the weight ratio of component (A) to component (B) is 10/90.

* * * * *